(12) United States Patent
Fliesler et al.

(10) Patent No.: US 6,770,938 B1
(45) Date of Patent: Aug. 3, 2004

(54) DIODE FABRICATION FOR ESD/EOS PROTECTION

(75) Inventors: Michael Fliesler, Santa Cruz, CA (US); Mark Ramsbey, Sunnyvale, CA (US); Mark Randolph, San Jose, CA (US); Ian Morgan, San Jose, CA (US); Timothy Thurgate, Sunnyvale, CA (US); Paohua Kuo, San Jose, CA (US); David M. Rogers, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/050,394

(22) Filed: Jan. 16, 2002

(51) Int. Cl.[7] .............................................. H01L 23/62
(52) U.S. Cl. ........................ 257/357; 257/358; 257/360; 257/361; 257/362; 257/363; 257/173
(58) Field of Search ................................ 257/355–358, 257/360–363, 173; 361/56, 111

(56) References Cited

U.S. PATENT DOCUMENTS

| | | | | |
|---|---|---|---|---|
| 3,590,340 A | * | 6/1971 | Kubo et al. ................. | 257/363 |
| 5,218,222 A | | 6/1993 | Roberts ....................... | 257/362 |
| 5,270,565 A | | 12/1993 | Lee et al. .................... | 257/358 |
| 5,272,371 A | | 12/1993 | Bishop et al. ............... | 257/362 |
| 5,416,351 A | * | 5/1995 | Ito et al. ...................... | 257/357 |
| 5,430,595 A | | 7/1995 | Wagner et al. ................ | 361/56 |
| 5,530,612 A | | 6/1996 | Maloney ....................... | 361/56 |
| 5,852,315 A | | 12/1998 | Ker et al. ..................... | 257/355 |
| 5,907,464 A | | 5/1999 | Maloney et al. ............. | 361/111 |
| 6,002,155 A | * | 12/1999 | Tahara et al. ................ | 257/355 |
| 6,028,758 A | | 2/2000 | Sharpe-Geisler ............. | 361/111 |
| 6,043,969 A | | 3/2000 | Sharpe-Geisler ............. | 361/111 |
| 6,091,595 A | | 7/2000 | Sharpe-Geisler ............. | 361/111 |

* cited by examiner

*Primary Examiner*—Minhloan Tran
*Assistant Examiner*—Thomas L Dickey
(74) *Attorney, Agent, or Firm*—Amin & Turocy, LLP (57) ABSTRACT

An ESD protection device is provided for an integrated circuit. The ESD protection device includes a power supply clamp device formed from a diode and coupled between a first power supply $V_{CC}$ and a second power supply $V_{SS}$. An input protection device is also provided which is formed from a diode coupled between an input pad and the first power supply and a second diode coupled between the input pad and a second power supply. The diodes have an adjusted reverse breakdown voltage that is higher than the voltage supply $V_{CC}$ used to power the peripheral circuitry that drives circuitry within a core of the integrated circuit. The adjusted reverse breakdown voltage is also lower than the breakdown voltage of gate oxide layers used within the peripheral circuitry.

6 Claims, 7 Drawing Sheets

DIODE FABRICATION FOR ESD/EOS PROTECTION

FIELD OF THE INVENTION

The present invention generally relates to semiconductor devices and, more particularly, relates to electrostatic protection devices for integrated circuits

BACKGROUND OF THE INVENTION

Electro-static discharge (ESD) or electrical overstress (EOS) is an increasingly significant problem in integrated circuit design as pin counts and faster circuit speeds compound the need for reliable ESD protection. ESD refers to the phenomena whereby a high energy electrical discharge of current is produced at the input and/or output nodes of an integrated circuit as a consequence of static charge build-up on an IC package. The static charge build up can be as a result of a human body handling the IC or due to static charge build up from IC manufacturing handling equipment. Electrostatic discharge has the potential to disable or destroy an entire integrated circuit. Therefore, much effort has been spent in designing adequate ESD protection devices. Ideally, an ESD protection device should be able to discharge an extremely large potential across any two pins of an IC in a nondestructive manner.

Typically, the first circuitry electrically connected to the integrated circuit pads is some type of input/output buffer or level shifter circuit. These devices serve to buffer the logic devices on the integrated circuit and bear the brunt of the ESD problems. In the case of Complimentary Metal Oxide Semiconductor (CMOS) integrated circuit design, the CMOS devices in the integrated circuit will be buffered from the input/output pads by one or more CMOS inverters having wide Field Effect Transistors (FETS) which serve to buffer the internal logic gates from the input/output pad. Therefore, in a typical ESD event, a high voltage applied to an input/output pad would result in a high discharge current to flow through one of the transistors of the CMOS inverter gate to $V_{DD}$ or $V_{SS}$, respectively. One type of discharge path may occur from the output pad through a channel FET to $V_{SS}$. Depending upon the polarity of the ESD voltage pulse supplied at the pad, the discharge may either proceed via an avalanche breakdown of the drain/channel junction of the n channel FET or via a forward biasing of the drain/channel diode. The avalanche breakdown type of discharge path is the most destructive since it is most likely to result in irreversible damage to the structure of the n channel FET.

One difficulty in designing ESD protection circuits is the demanding performance requirements that must be met. For example, one of the primary industry standards for measuring robustness is the military standard method MIL-STD-883C method 3015.7 Notice 8 (1989) and its follow on Human Body Model (HBM) standard no. 5.1 (1993) from the EOS/ESD Association. Both of these standards require ESD zapping for what can be a large number of pin and power supply combinations. ICs have come under pressure in HBM tests because of repeated stressing of the power supply rails leading to wear out of various breakdown points, such as the $V_{CC}$ lines. A reliable powers supply clamp is needed to reduce the susceptibility of the $V_{CC}$ power bus failure mechanism. One conventional methodology relied on in designing protection circuits is known as the snap-back phenomena. The snap-back phenomena refers to the use of a junction breakdown to control current and voltage behavior in the manner of a voltage clamp. A snap-back device is designed to keep the voltage low enough to protect sensitive gate dielectrics.

Figure 1:
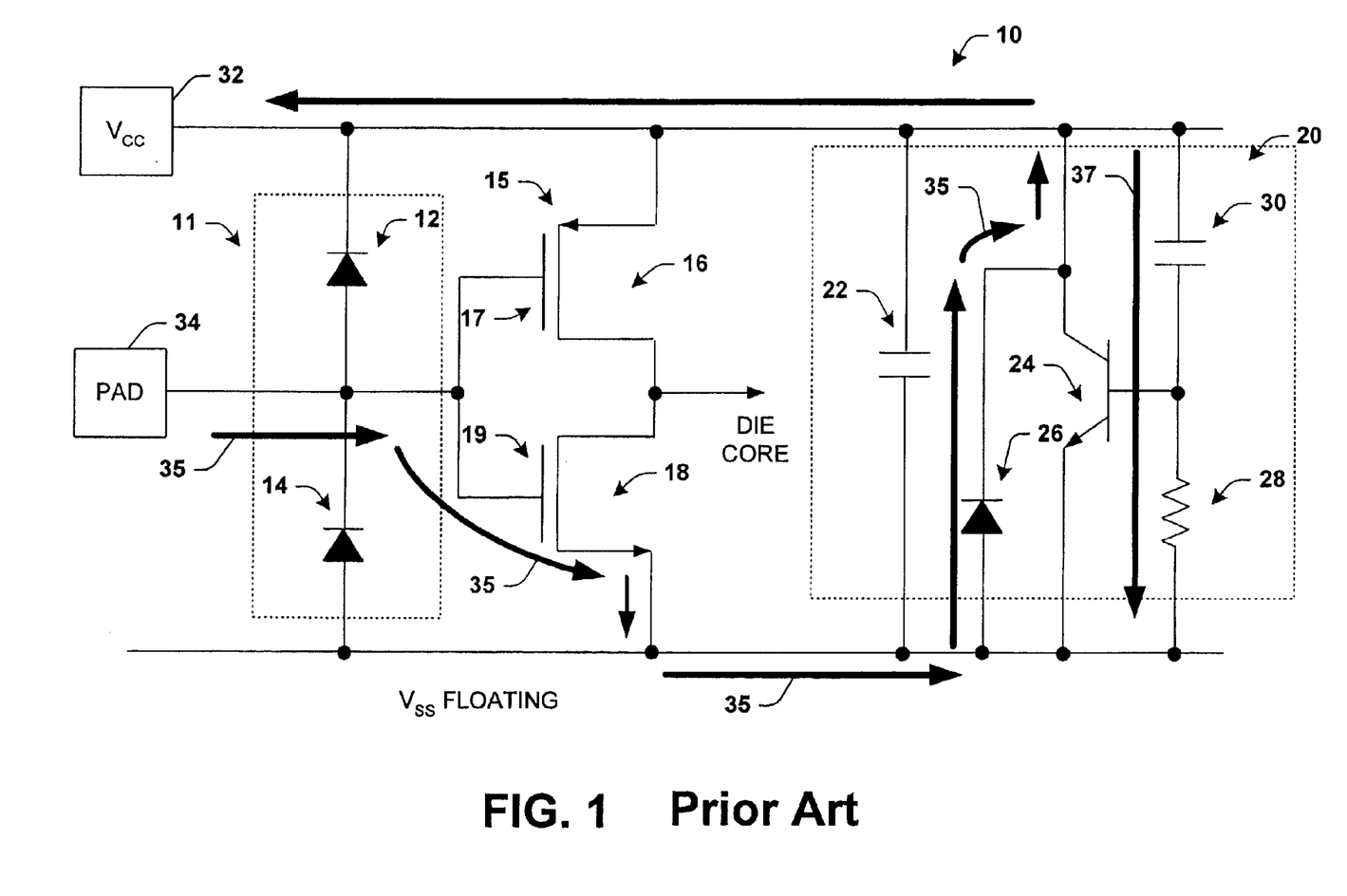
FIG. 1 illustrates a schematic diagram of ESD protection device circuitry residing at a peripheral region of an integrated circuit in accordance with the prior art

FIG. 1 illustrates one conventional system 10 of peripheral circuitry employing ESD devices utilizing the snap-back phenomena. A pad 34 is coupled to a buffer or level shifting circuit 15 comprised of a PMOS transistor 16 and an NMOS transistor 18 configured as a complimentary CMOS inverter. The PMOS transistor 16 includes a gate oxide layer 17 and the NMOS transistor 18 includes a gate oxide layer 19. The output of the CMOS inverter 15 is coupled to circuitry (not shown) in the die core. A power supply clamp device 20 is coupled between $V_{CC}$ and $V_{SS}$ for protecting the power supplies from an ESD event. The power supply clamp device 20 is comprised of a bipolar junction transistor (BJT) 24 with a diode 26 connected in parallel across the collector of the BJT 24. A capacitor 30 is coupled to the base of the BJT 24 and the supply $V_{CC}$ and a resistor 28 is coupled to the base of the BJT 24 and the supply $V_{SS}$. A capacitor 22 is coupled to the supply $V_{CC}$ and the supply $V_{SS}$. An input protection circuit 11 comprises a first diode 12 with its cathode coupled to the supply $V_{CC}$ and its anode coupled to the pad 34 and a second diode 14 with its anode connected between the supply $V_{SS}$ and its cathode connected to the pad 34. During a negative polarity ESD stress applied between the pad 34 and the $V_{CC}$ supply 32, some of the current follows the path 35 along the arrows through the NMOS transistor 18 and the diode 26 back to the supply $V_{CC}$. Since the diode 14 has a reverse break down voltage of about 12–13 volts and the break down voltage of the gate oxide layers 17 and 19 are about 9–10 volts, there is potential for damage to the gate oxide layer 19 along the current path 35, until the ESD voltage reaches 12–13 volts and the diode 14 begins to conduct in the reverse breakdown region. The ESD circuit of the system 10 also requires the diode 26, so that the current path 35 can flow to the supply $V_{CC}$. Therefore, the diode 26 is necessary and takes up additional space on the IC die. If a positive stress is applied to $V_{CC}$ the current will discharge through the BJT 24 along the path 37. However, the BJT 24 switches slowly and sometimes still results in damage to the integrated circuit. Other problems with the use of a BJT is that the device takes up a great deal of space on the integrated circuit die and is not conducive to scalability as other devices shrink in size.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to an ESD protection device for an integrated circuit. The ESD protection device includes a power supply clamp device formed from a diode and coupled between a first power supply $V_{CC}$ and a second power supply $V_{SS}$. An input protection device is also provided which is formed from a diode coupled between an input pad and the first power supply and a second diode coupled between the input pad and a second power supply. The diodes have an adjusted reverse breakdown voltage that is higher than the voltage supply $V_{CC}$ used to power the peripheral circuitry that drives circuitry within a core of the integrated circuit. The adjusted reverse breakdown voltage is also lower than the breakdown voltage of gate oxide layers used within the peripheral circuitry.

In one aspect of the invention, the diodes are formed by providing heavily doped N++ and P++ regions in a p-substrate to adjust the reverse breakdown voltages of the diodes. The diode can be formed in a guard ring of the integrated circuit device without requiring additional real estate on the integrated circuit device. The heavily doped regions are provided by first providing a P+ implant into an active region of a peripheral region of an integrated circuit device to form a P++ region in the p-substrate. A first N+ implant is then performed into a portion of the P++ region to form a N+ region. A second implant is then performed into the N+ region to form the heavily doped N++ region. Various connections may be provided to the N++ and P++ heavily doped regions based on whether the device is a power supply clamp or an input protection device.

In another aspect of the invention, the integrated circuit is a flash memory device that is formed in a core region of a die of the integrated circuit. The protection devices or diodes are formed using standard implants employed for fabricating the integrated circuit. One or more masks which are employed during various core implants to fabricate the flash memory device are also opened up at the peripheral region of the integrated circuit over the protection devices, so that the protection devices may be formed during the flash memory fabrication process.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 7 illustrates a schematic block diagram of a substrate development system for applying various different materials in accordance with one aspect of the present invention.

DETAILED DESCRIPTION OF THE INVENTION

The present invention relates to an ESD protection device for an integrated circuit and a method of making the same. The ESD protection device is comprised of at least one diode that has an adjusted reverse breakdown voltage that is higher than a voltage supply powering peripheral circuitry that drives circuitry within a core of the integrated circuit. The adjusted reverse breakdown voltage is lower than the breakdown voltage of gate oxide layers used within the peripheral circuitry. A first diode may be provided as a power supply clamp, while a second and third diode may be provided to form an input protection circuit to protect the power supply and the gate oxide layers of the peripheral circuitry from ESD events. The diodes are formed by providing heavily doped N++ and P++ regions to adjust the reverse breakdown voltages of the diodes. The present invention will now be described with reference to the drawings, wherein like reference numerals are used to refer to like elements throughout. It should be understood that the description is merely illustrative and that it should not be taken in a limiting sense.

Figure 2:
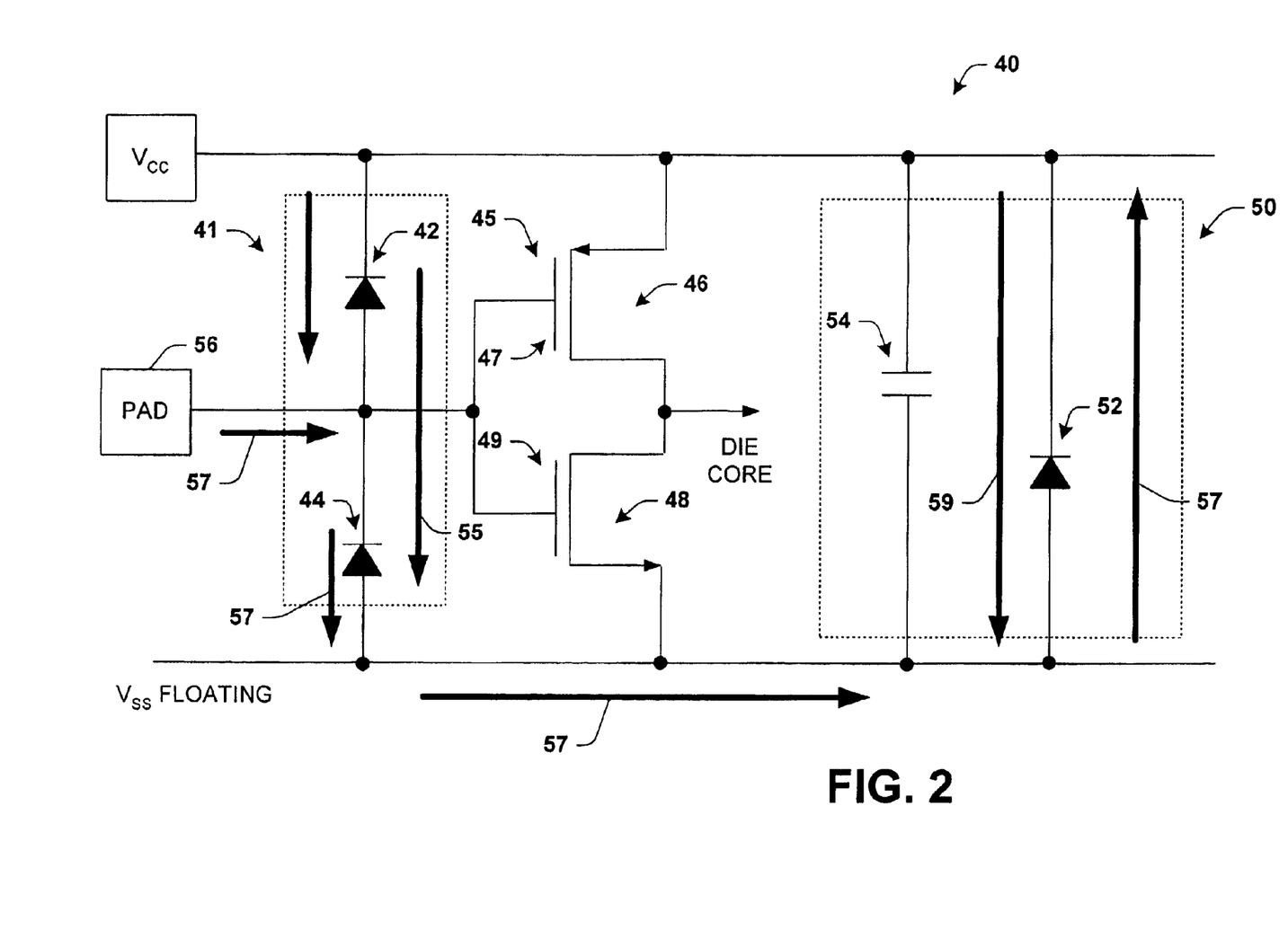
FIG. 2 illustrates a schematic diagram of ESD protection device circuitry residing at a peripheral region of an integrated circuit in accordance with the present invention.

FIG. 2 illustrates a system 40 of peripheral circuitry employing ESD devices in accordance with the present invention. A pad 56 is coupled to an input buffer or level shifting circuit 45 comprised of a PMOS transistor 46 and an NMOS transistor 48 configured as a complimentary CMOS inverter. The PMOS transistor 46 has a gate oxide layer 47 and the NMOS transistor 48 has a gate oxide layer 49. The output of the complimentary CMOS inverter 45 is coupled to circuitry (not shown) in the die core. A power supply clamp device 50 is coupled between $V_{CC}$ and $V_{SS}$ for protecting the power supplies from an ESD event. The power supply clamp device 50 is comprised of a single diode 52 with its anode connected to the supply $V_{SS}$ and its cathode connected to the supply $V_{CC}$. The capacitor 54 represents the internal circuitry on the integrated circuit die. The diode 52 has an adjusted reverse breakdown voltage that lies between the voltage of the supply $V_{CC}$ and the breakdown voltage of the gate oxide layers 47 and 49 in the transistors 46 and 48. For example, the reverse breakdown voltage $B_{VR}$ of the diode 52 can be governed by the following equation: $V_{CC}+2V<B_{VR}<Bvox$ where $V_{CC}$ is the supply voltage and Bvox is the breakdown voltage of the gate oxide layers of the transistors of input circuit 45.

An input protection device 41 comprises a first diode 42 with its cathode coupled to the supply $V_{CC}$ and its anode coupled to the pad 56 and a second diode 44 with its anode connected between the supply $V_{SS}$ and its cathode connected to the pad 34. Both diodes have an adjusted breakdown voltage similar to the adjusted breakdown voltage of the diode 52, so that the current path through the transistor 48 is eliminated.

During a negative polarity ESD stress applied between the pad 56 and the $V_{CC}$ pad, the current follows a path 57 along the arrows through the diodes 44. Since the breakdown voltage of the diode 44 is smaller than the breakdown voltage of the oxide layers 47 and 49 of the transistors 46 and 48, the diode 44 begins conducting before the gate oxide can be damaged. During a positive polarity ESD stress applied to the $V_{CC}$ supply, the current flow follows a path 55 through diodes 42 and 44 and a path 59 through the diode 52 back to the supply $V_{SS}$. Again the diodes begin conducting prior to the voltage reaching the breakdown voltage of the gate oxide layers 46 and 48 on the input of the transistors 46 and 48. The diodes 42, 44 and 52 are much faster and smaller than the BJT of the conventional device. Additionally, the diodes are scalable along with the circuitry in both the periphery and core regions of the integrated circuit. The diodes also exhibit a low impedance and are compatible with standard CMOS processing. The diode junction has a very consistent tightly controlled breakdown voltage that is not very sensitive to temperature and manufacturing process variations. Furthermore, the diode junction exhibits faster trigger voltage characteristics compared to the BJT and CMOS devices.

Figure 3:
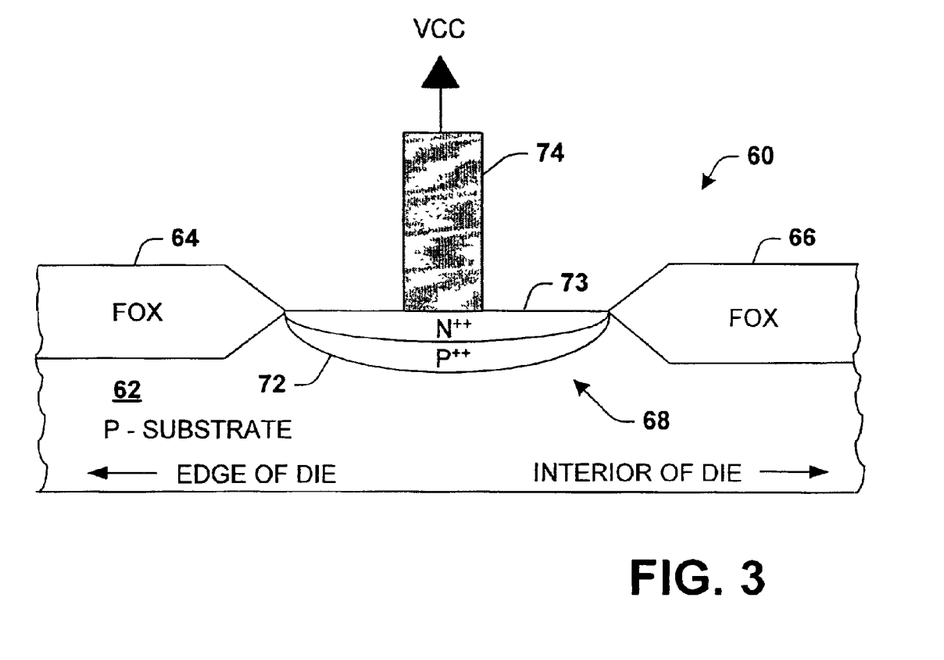
FIG. 3 is a schematic cross-sectional illustration of a protection device in accordance with one aspect of the present invention.

FIG. 3 is a schematic cross-sectional illustration of a peripheral region of an integrated circuit device 60 in accordance with the present invention. The integrated circuit device 60 includes a p-substrate layer 62 comprising silicon, for example. The substrate layer 62 becomes the active region for device fabrication. Field oxide regions 64 and 66 are formed over the p-substrate layer 62. The field oxide region 64 is formed toward the edge of the die, while the field oxide region 66 is formed toward the interior of the die. The field oxide regions 64 and 66 can be formed via a LOCOS (Local Oxidation Of Silicon) process. The basic steps of the LOCOS process involve forming field oxide isolation regions in between transistors on a silicon wafer by conventional techniques.

The device structure 68 is a diode type device and includes an $N^{++}$ cathode region 73 and a $P^{++}$ anode region 72. The $N^{++}$ cathode region 73 and the $P^{++}$ anode region 72 include additional heavier doping steps to adjust the breakdown voltage of the diode 68 to be a voltage between $V_{CC}$ and the breakdown voltage of the gate oxide layers 47 and 49 on the input transistors 46 and 48. A contact 74 couples the supply $V_{CC}$ to the $N^{++}$ cathode region 73. The contact 74 can be formed through an insulation layer (not shown) by conventional techniques. The contact 74 may be formed from tungsten or the like. A connection is made to $V_{SS}$ through the P-Substrate 62. Although, the device structure 68 is illustrated with respect to the power supply clamp device, different connections can be made to form the input protection diodes employing the same diode.

Figure 4:
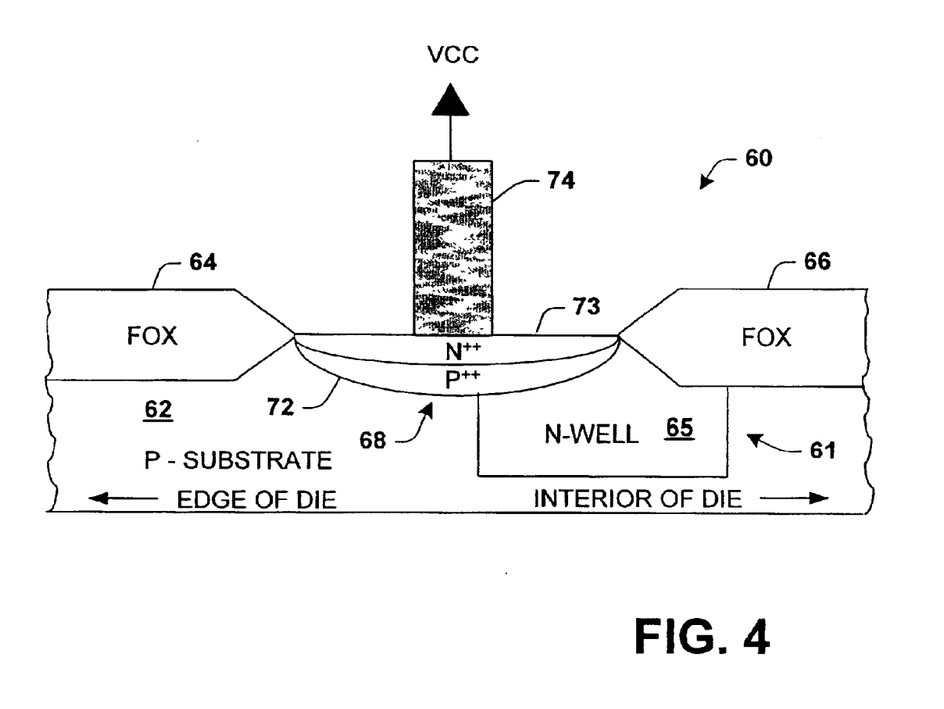
FIG. 4 is a schematic cross-sectional illustration of a protection device residing in a guard ring in accordance with one aspect of the present invention.

FIG. 4 illustrates fabrication of the diode 68 in a guard ring 61 formed around an annular region about the periphery of the integrated circuit 60. The guard ring 61 is formed of a N-Well region 65 and is provided as a standard structure to mitigate latch up of the devices on the integrated circuit. Building the protection diodes into the N-well region 65 requires no additional real estate on the die of the integrated circuit. Additionally, since the diodes are smaller than the BJT device they are easy to fabricate at the edge of the core and, thus, save chip area. Furthermore, modification of the guard ring 61 does not compromise the characteristics of either the guard ring 61 or the diode 65 and mitigates latch up of the integrated circuit.

Figure 5:
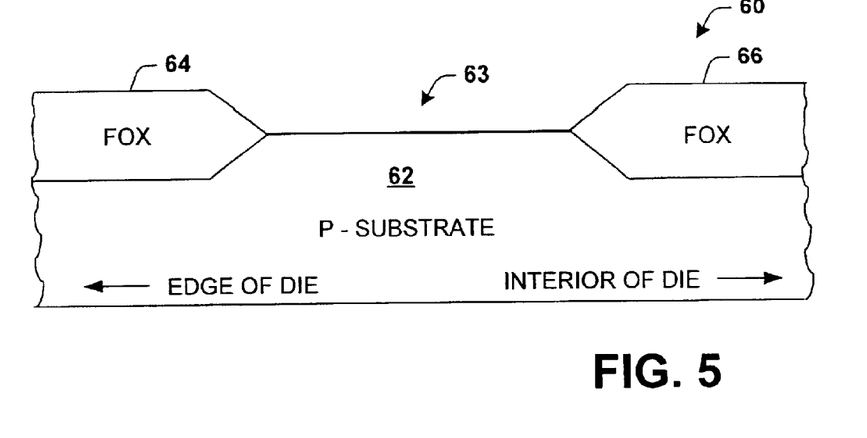
FIG. 5 is a schematic cross-sectional illustration of a p-substrate at a peripheral region of an integrated circuit in accordance with one aspect the present invention.

Turning now to FIGS. 5–12, fabrication in connection with forming the diode structure 68 of FIG. 3 is discussed. FIG. 5 illustrates a portion of an integrated circuit 60 at a peripheral region of the integrated circuit 60. The integrated circuit 60 includes a p-substrate layer 62 with field oxide regions 64 and 66 formed over the p-substrate layer 62 on opposite sides of an active device region 63. The field oxide region 64 is formed toward the edge of the die, while the field oxide region 66 is toward the interior of the die. The field oxide regions 64 and 66 can be formed via a Local Oxidation of Silicon (LOCOS) isolation process.

Figure 6:
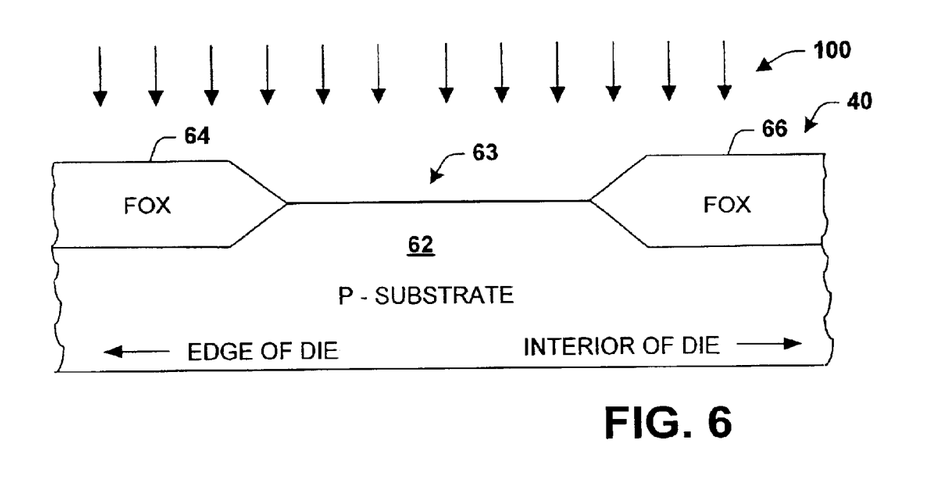
FIG. 6 is a schematic cross-sectional illustration of the structure of FIG. 5 undergoing a p-type implant in accordance with one aspect of the present invention.
Figure 7:
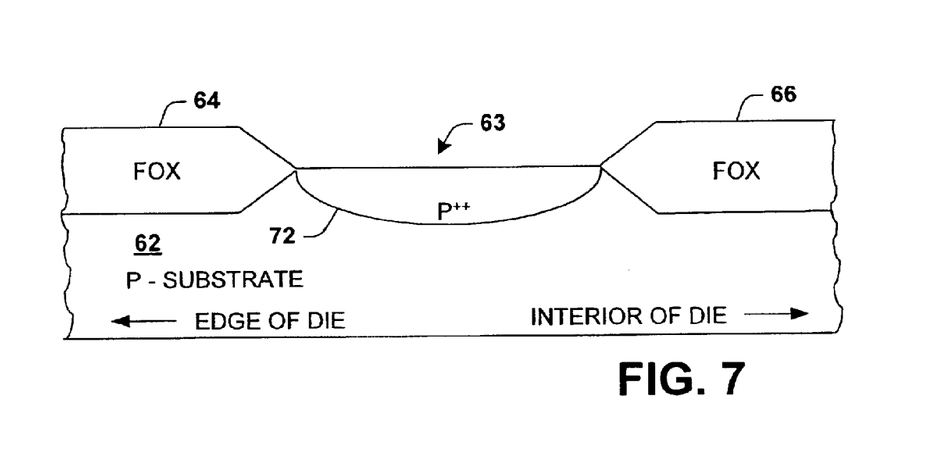
FIG. 7 is a schematic cross-sectional illustration of the structure of FIG. 6 after the p-type implant in accordance with one aspect of the present invention.
Figure 8:
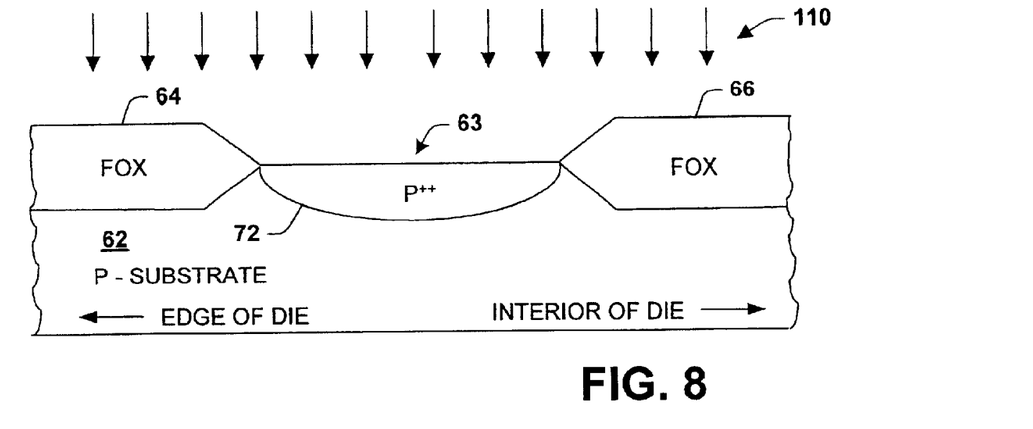
FIG. 8 is a schematic cross-sectional illustration of the structure of FIG. 7 undergoing a first n-type implant in accordance with one aspect of the present invention.
Figure 9:
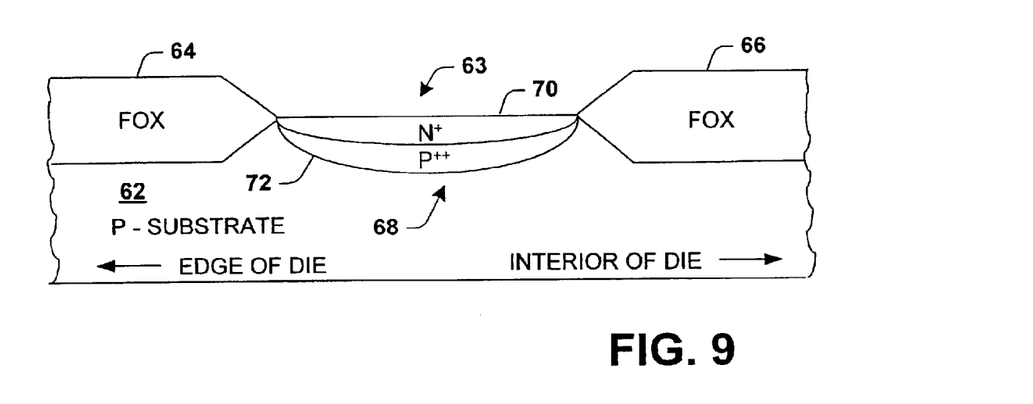
FIG. 9 is a schematic cross-sectional illustration of the structure of FIG. 8 after undergoing the first n-type implant in accordance with one aspect of the present invention.
Figure 10:
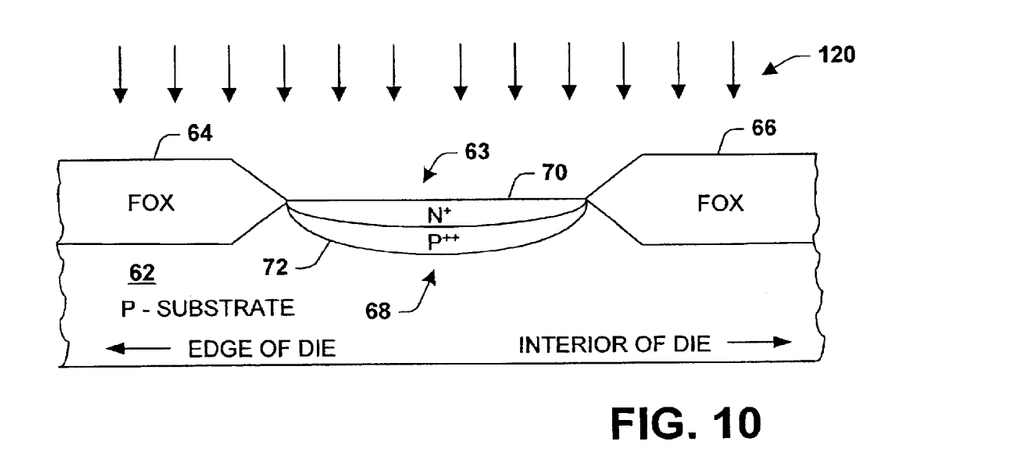
FIG. 10 is a schematic cross-sectional illustration of the structure of FIG. 9 undergoing a second n-type implant in accordance with one aspect of the present invention.
Figure 11:
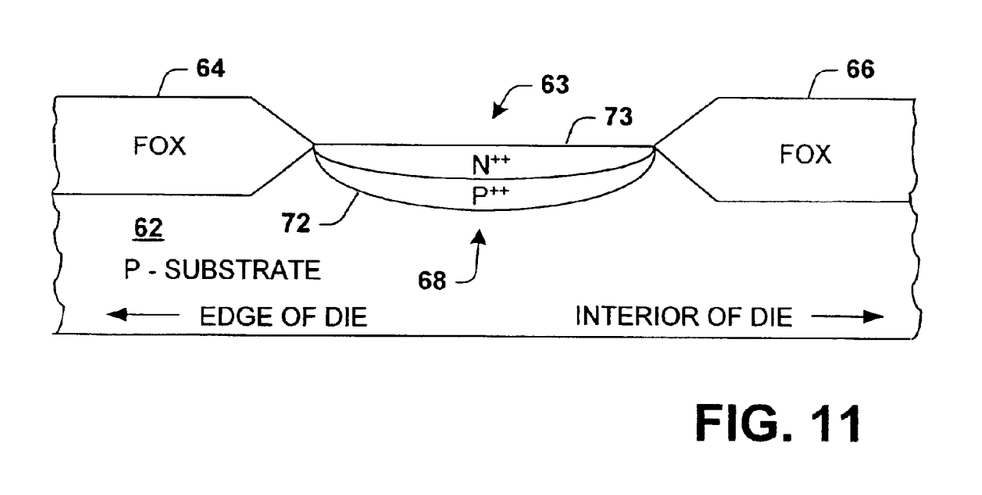
FIG. 11 is a schematic cross-sectional illustration of the structure of FIG. 10 after undergoing the second n-type implant in accordance with one aspect of the present invention.

FIG. 6 illustrates a $P^+$ implant 100 (e.g., boron) having a dose within the range of $1\times10^{12}$ to $1\times10^{15}$ atoms/cm$^2$ and implanted at an energy range of about 30 KeV to about 50 KeV in the active device region 63. The $P^+$ implant 100 is masked so that it dopes one or more protection devices and does not dope other peripheral devices (e.g., internal drive devices). The $P^+$ implant 100 forms a heavily doped $P^{++}$ region 72 (FIG. 7) in the p-substrate 62. Next an $N^+$ type implant 110 is performed (e.g., arsenic, phosphorous) having a dose within the range of $1\times10^{14}$ to $1\times10^{16}$ atoms/cm$^2$ and implanted at an energy range of about 50 KeV to about 70 KeV in the active device region 63, as illustrated in FIG. 8. The $N^+$ implant 120 forms a doped $N^+$ region 70 (FIG. 9) in the heavily doped $P^{++}$ region 72. A second $N^+$ type implant (e.g., arsenic, phosphorous) is performed having a dose within the range of $1\times10^{13}$ to $1\times10^{15}$ atoms/cm$^2$ and implanted at an energy range of about 50 KeV to about 70 KeV in the active device region 63, as illustrated in FIG. 10. The $N^+$ implant 120 forms a heavily doped $N^{++}$ region 73 (FIG. 11) in the doped $N^+$ region 70.

Figure 12:
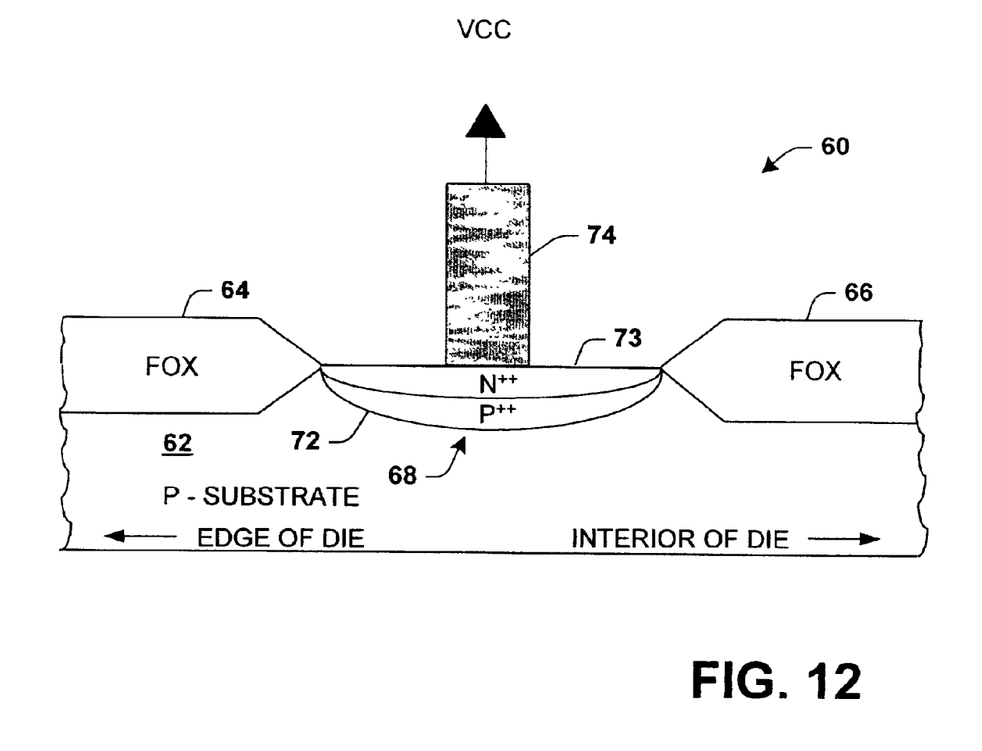
FIG. 12 is a schematic cross-sectional illustration of the structure of FIG. 11 after a contact is formed connecting the device to $V_{CC}$ in accordance with one aspect of the present invention.

A contact 74 is formed coupling $V_{CC}$ to the heavily doped $N^{++}$ region 73 (FIG. 12). For example, a TEOS oxide deposition step may be performed over the structure 60. An etch step (e.g., anisotropic reactive ion etching (RIE)) may be performed to form a via in the isolation layer, so that the contact can be provided. A patterned photoresist may be used as a mask for selectively etching the isolation layer. Any suitable etch technique may be used to etch the isolation layer. For example, the isolation layer can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer to thereby create the via in the isolation layer. Thereafter, the via is filled with metal to form a conductive contact to the diode 68.

The heavily doped $N^{++}$ region 73 and the heavily doped $P^{++}$ region 72 forms a protection diode with reverse breakdown voltage that is greater than the supply voltage but less than the gate oxide breakdown voltage of the input CMOS devices utilized as buffers or level shifters. It is to be appreciated that various combinations of doping steps may be employed to create the heavily doped $N^{++}$ region 73 and the heavily doped $P^{++}$ region 72 that form a protection diode with reverse breakdown voltage greater than the supply voltage but less than the gate oxide breakdown voltage of the input CMOS devices. Of course it will be appreciated that any suitable dose and energy range and implant may be employed to carry out the present invention. In one aspect of the invention, the reverse breakdown voltage is between 7–9 volts for a $V_{CC}$ of 5 volts.

In another aspect of the invention, the core region of the integrated circuit is a conventional flash memory device. A number of core implants are provided to fabricate the flash memory device and to improve the program and erase characteristics of the cells of the flash memory device. For example, an n-field implant (NCI) can be performed to provide isolation between transistor memory cells. A core implant (CI) can be performed to alter the program and erase characteristics of the transistor flash memory cells. A double diffuse implant (DDI) is typically applied to the source of the flash memory transistors to alter the erase characteristics of the flash memory transistor cells. A medium doped drain implant (MDD) is applied to the drain of the transistor memory cells and effects the programming characteristics of the memory cells. A lightly doped implant (NLI) forms $N^-$ lightly doped regions in the flash memory cell transistors, while a normal $N^+$ source and drain (NPS) implant is performed to form source and drain regions in the transistor memory cells in addition to forming conventional protection diode devices. A normal contact implant (CTI) forms doping contact regions of the transistor memory cells. It was discovered that some of these implants can be employed in provide doping concentrations in the peripheral protection device regions to change the reverse breakdown characteristics of the devices without adding additional implant steps to the process of fabricating the flash memory device. All that is necessary is to open the mask at the peripheral edge over the protection device region. Various combinations were employed to alter the reverse breakdown voltage of the protection diode as illustrated in Table 1.

TABLE 1

| Implant Mask Split | | | | | |
|---|---|---|---|---|---|
| NPS | MDD | CI | DDI | Comments | Predicted $B_{VR}$ |
| YES | NO | NO | NO | Std. $N^+$ S/D Bvj | 13 v |
| YES | NO | YES | NO | CI | 7.5 v |
| YES | YES | NO | NO | MDD | 12 v |
| YES | YES | YES | NO | MDD + CI | 7.4 v |
| YES | NO | YES | YES | DDI + CI | 8.1 v |
| YES | YES | YES | YES | MDD, CI, DDI | 8.7 v |

As illustrated in table 1, various combination provide for the desired breakdown voltage of $B_{VR}$ that satisfies the equation of $V_{CC}+2V<B_{VR}<Bvox$. The most optimal result was determined to be about 8.1 volts employing the DDI and CI implants. It is to be appreciated that additional process steps are eliminated by employing the core implant steps associated with forming the flash memory device. Furthermore, the protection diode device of the present invention may be retrofitted into existing designs with simple mask layer changes to provide the additional doping steps to modify the diode reverse breakdown voltage. Furthermore, the present invention allows for future generations of transistor oxide scaling.

Figure 13:
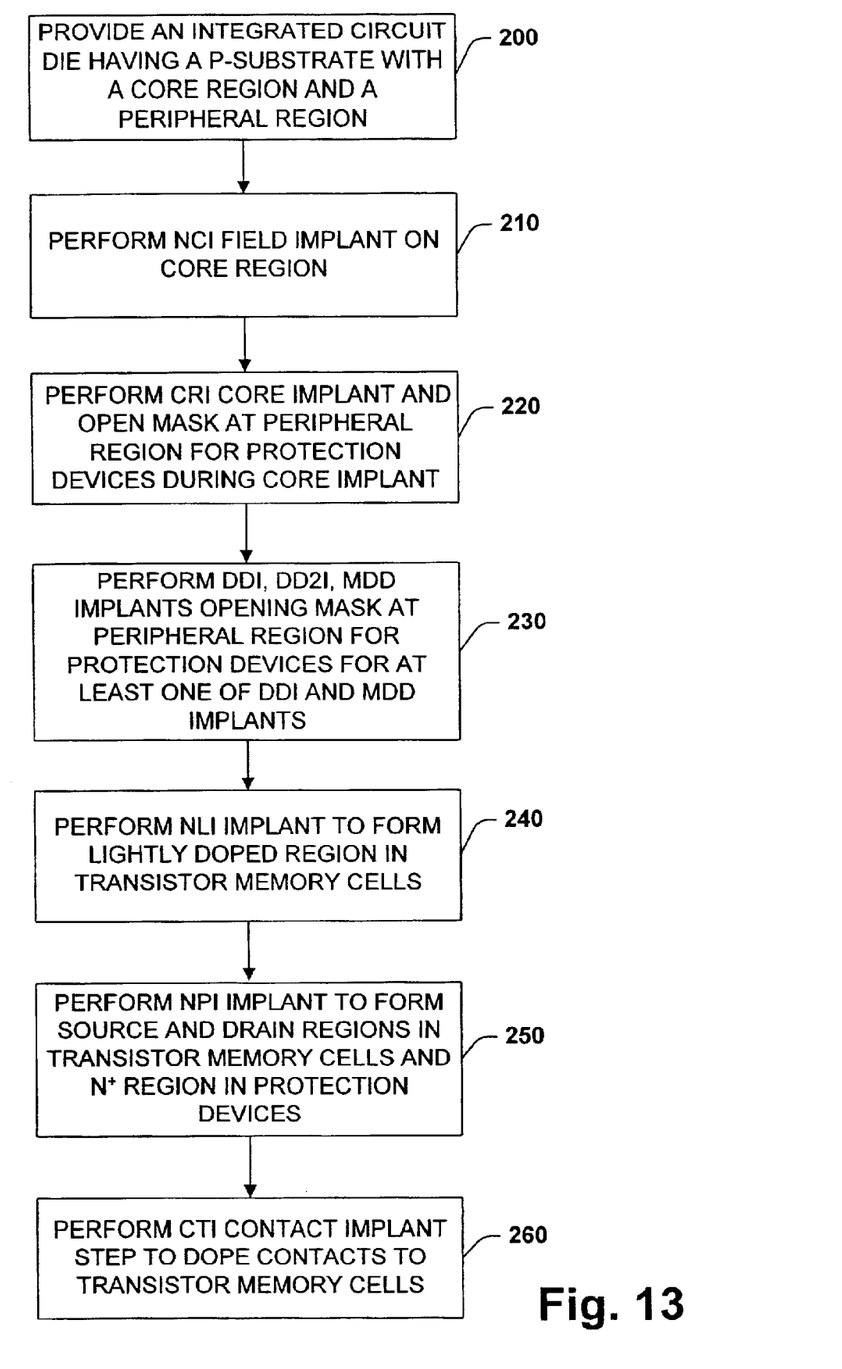
FIG. 13 is a flow diagram illustrating one particular methodology of fabricating protection devices utilizing implants employed in fabricating a core region of an integrated circuit in accordance with the present invention.

FIG. 13 illustrates a flow diagram of forming ESD protection devices in accordance with the present invention during fabrication of a flash memory device. At 200, an integrated circuit having a p-substrate with a core region and a peripheral region is provided. At 210, an NCI field implant step is performed on the core region to isolate transistor memory cells from one another. At 220, the core implant mask is opened at the peripheral region for fabrication of the protection devices and the CRI core implant step is performed. The DDI and MDD implants are then performed on the core region at 230. At least one of the DDI and MDD masks are opened at the peripheral region for forming the protection devices during the DDI and MDD implants. At 240, an NLI implant is performed on the core region to form lightly doped regions in the transistor memory cells. At 250, an NPI implant is performed to form source and drain regions in the transistor memory cells and $N^+$ regions in the protection devices. A CTI contact implant is then performed to dope contacts to the transistor memory cells at 260.

It is to be appreciated that although the present example of FIG. 13 was illustrated with respect to forming an integrated circuit with a core region with flash memory cells, various other integrated circuit types can be employed to carry out the present invention. The various implant steps of those integrated circuit types can be utilized to forming protection diodes having the breakdown characteristics associated with the example described above What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for protecting an integrated circuit from electrostatic discharge, the system comprising:
   a core region;
   a pad electrically coupled to the core region through an input device, the input device having at least one CMOS device with a gate oxide layer; and
   at least one protection diode openable to provide a discharge path for electrostatic discharge due to a high voltage being applied to the pad wherein the at least one protection diode has a reverse breakdown voltage less than the breakdown voltage of the gate oxide layer and greater than an applied supply voltage, the reverse breakdown voltage of the at least one diode is determined by the equation $V_{CC}+C<B_{VR}<Bvox$ where $V_{CC}$ is the supply voltage, C is a predetermined voltage of 2 volts or more and matches $V_{CC}$ in sign, Bvox is the breakdown voltage of the gate oxide layer and $B_{VR}$ is the reverse breakdown voltage of the at least one diode.

2. The system of claim 1, the at least one diode comprising a first diode and a second diode forming an input protection circuit adapted to protect the input device.

3. The system of claim 1, the at least one diode comprising a power supply clamp diode.

4. The system of claim 1, the at least one diode comprising a heavily doped $N^{++}$ region and a heavily doped $P^{++}$ region.

5. The system of claim 1, the input device being a CMOS inverter formed from a PMOS and an NMOS transistor.

6. The system of claim 1, the core region comprising a flash memory device.

* * * * *